United States Patent [19]
DeJarnette

[11] 3,943,435
[45] Mar. 9, 1976

[54] TRANSFORMER HAVING IMPROVED VOLTAGE AND PHASE CHARACTERISTICS

[75] Inventor: Malcolm B. DeJarnette, Rustburg, Va.

[73] Assignee: General Electric Company, Lynchburg, Va.

[22] Filed: Aug. 12, 1974

[21] Appl. No.: 496,373

[52] U.S. Cl. .................. 323/76; 323/48; 323/60; 323/81; 323/124; 307/92
[51] Int. Cl.² ................. H02P 13/00; G05F 1/68
[58] Field of Search .......... 323/6, 44 R, 48, 60, 61, 323/91, 93, 124, 128, 76, 81; 317/14 R, 14 A, 50, 256; 307/92, 93

[56] References Cited
UNITED STATES PATENTS

| | | | |
|---|---|---|---|
| 2,510,631 | 6/1950 | Harder | 323/61 |
| 3,401,272 | 9/1968 | Rosa et al. | 317/50 |
| 3,684,948 | 8/1972 | Eissmann | 323/61 |

FOREIGN PATENTS OR APPLICATIONS

| | | | |
|---|---|---|---|
| 1,150,228 | 4/1969 | United Kingdom | 323/61 |

Primary Examiner—Gerald Goldberg
Attorney, Agent, or Firm—James J. Williams

[57] ABSTRACT

A coupling capacitor voltage transformer or potential transformer has its secondary winding tapped to provide a predetermined voltage across a portion of the secondary winding. The transformer is improved by an inductive reactance added in series with the secondary tap. The magnitude of the added inductive reactance is selected so that the sum of the added reactance and the leakage reactance between the transformer primary winding and the portion of the secondary winding referred to the primary is equal to the leakage reactance between the primary winding and the full secondary winding referred to the primary. Under this equality condition, the phase relation between the primary and secondary voltages will be the same for a standard type burden or equivalent burdens connected either across the portion of the secondary winding or across the full secondary winding. The added inductive reactance may also be used with a separate secondary winding having a lower referred leakage reactance to provide a phase relation for that secondary winding that is the same as the phase relation for the secondary winding having a higher referred leakage reactance.

3 Claims, 4 Drawing Figures

TRANSFORMER HAVING IMPROVED VOLTAGE AND PHASE CHARACTERISTICS

BACKGROUND OF THE INVENTION

My invention relates to a coupling capacitor voltage transformer having a tapped secondary winding or separate secondary windings to which burdens may be arbitrarily connected, and particularly to such a transformer having improved phase shift characteristics between the primary winding and the secondary winding.

In high voltage power line systems, it is desirable or necessary that the line voltage and line phase be accurately measured or indicated so that power metering or other functions can be properly provided. Typically, this measurement is made with a plurality of capacitors connected in series between the high voltage line and ground. The primary winding of a coupling capacitor voltage transformer is connected in series with a tuning inductor, and this series circuit is connected between a point in the series of capacitors and ground or a reference point. The transformer is provided with one or more tapped secondary windings which provide isolation and the desired voltage magnitude, usually reduced with respect to the primary voltage. Measuring or switching equipment is connected to a secondary winding. This equipment may be connected across a full secondary winding or across only a portion of a tapped secondary winding, or across several windings, depending upon the characteristics and quantity of such equipment. The coupling capacitor voltage transformers I am aware of had a line to secondary voltage phase relation that depended upon and varied as a function of whether the burden was connected across the full secondary winding or across only a portion of the secondary winding. But since an accurate indication of the line to secondary voltage phase relation is needed to provide the proper measurement, a coupling capacitor voltage transformer having a more accurate line to secondary voltage phase relation is needed.

Accordingly, a primary object of my invention is to provide a new and improved coupling capacitor voltage or potential transformer which has a phase relation characteristic that is substantially constant for a burden connected across the full secondary winding of the transformer, or across only a portion of the secondary winding of the transformer, or across both windings.

Another object of my invention is to provide a new and improved coupling capacitor voltage or potential transformer having a secondary winding with an inductor connected to it so that the effective leakage inductance between the primary winding and this secondary winding is substantially equal to the effective leakage inductance between the primary winding and another secondary winding, thus providing a better primary to secondary voltage phase relation.

SUMMARY OF THE INVENTION

Briefly, these and other objects are achieved in accordance with my invention by a coupling capacitor voltage transformer having a primary winding adapted to be connected to a source of alternating electrical voltage. A secondary winding is coupled to the primary winding, and is provided with a tap between its ends to provide a portion having the desired ratio with respect to the full secondary winding. An inductor is connected in series with the tap of the secondary winding. The magnitude of the inductor is selected so that the sum of its inductive reactance added to the leakage reactance between the primary winding and a desired portion of the secondary winding and referred to the primary winding is substantially equal to the leakage reactance between the primary winding and the full secondary winding referred to the primary winding. If an inductor meeting this condition is provided in the tap, the phase relation between the primary and secondary windings are substantially the same, regardless of whether a given burden is connected across the full secondary winding, or across the desired portion of the secondary winding, or across both windings. Similarly, an inductor may be used for two separate secondary windings. Thus, a more accurate and more predictable voltage phase relation is provided by such a transformer, and hence a more accurate indication can be obtained.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawings, in which:

DESCRIPTION OF THE PREFERRED EMBODIMENT

Figure 1:
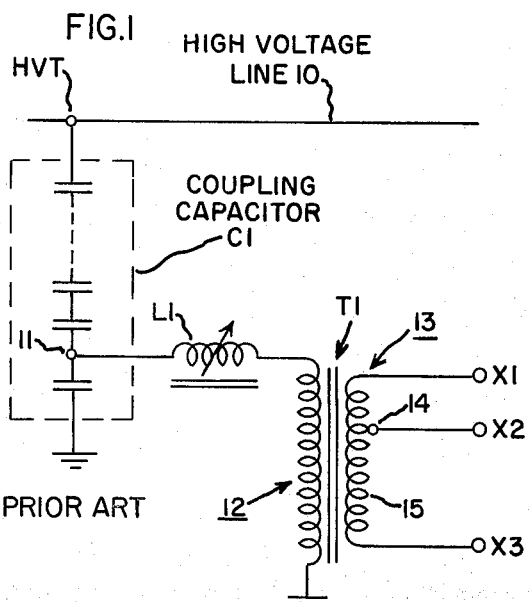
FIG. 1 shows a circuit diagram of a previously known coupling capacitor voltage transformer connected to a capacitor for measuring the voltage and phase of a power line.

FIG. 1 shows, by way of example only, an application of a known prior art coupling capacitor voltage transformer T1 for measuring voltage and phase. In this application, a high voltage line 10, possibly in the order of hundreds of kilovolts, must have its voltage and phase accurately measured. As known, a coupling capacitor C1 is connected between a high voltage terminal HVT on the line 10 and ground (or a reference point). Typically, the coupling capacitor C1 comprises a number, depending upon the voltage rating, of serially connected capacitors. If, for example, the voltage on the line 10 is 100 kilovolts and each capacitor should sustain one kilovolt, then 100 such capacitors would be needed. Various protecting coils, switches, and spark gaps are used in addition to the circuit elements shown in FIG. 1, but these have been omitted for clarity. Basically, the known circuit comprises an inductive reactor L1 connected between a tap 11 in the capacitor series and one end of the primary winding 12 of a voltage or potential transformer T1. The other end of the winding 12 is connected to a reference point such as ground. The reactor L1 is provided to tune out the capacitive reactance at the line frequency. Coupled to the primary winding 12 are one or more secondary windings 13. This transformer T1 is designed to be used with the capacitor C1 to provide the desired voltage ratio between the high voltage terminal HVT and the secondary winding 13. Each secondary winding 13 may have a tap 14 that provides a portion 15 having the desired voltage ratio with respect to the voltage across the full secondary winding 13. The ends of the secondary winding 13 are brought out to terminals X1, X3, and the tap 14 is brought out to terminal X2. Generally, because of the relatively high voltage between the tap 11 and ground, the transformer T1 has its primary winding 12 and full secondary winding 13 in a voltage stepdown relation so that a smaller voltage is provided across each of the secondary windings 13. Normally a coupling capacitor voltage transformer or potential transformer has a ratio on its nameplate which is designated "marked ratio". The marked ratio is the ratio of rated voltage between the high voltage terminal HVT and ground to rated secondary voltage. As an example of a transformer T1, the marked ratios are 600:1 for the full winding 13 and 1000:1 for the portion 15. The voltage transformer is then calibrated with various burdens in terms of deviation from its marked ratios and in terms of deviation of secondary voltage phase from that of the line. Under specified conditions, the coupling capacitor and transformer circuit of FIG. 1 has a true ratio equal to the voltage at the high voltage terminal HVT divided by the voltage across the full secondary winding 13 or the secondary portion 15. Since the true ratio changes as a function of burden due to the voltage drop from internal impedances, the measured secondary voltage for a given burden must be multiplied by a corrected marked ratio in order to reflect the true voltage between the high voltage terminal HVT and ground or reference. Measuring equipment for voltage and/or phase may be connected across either the full secondary winding 13 (terminals X1, X3). Or, separate equipment may be respectively connected across the full winding 13 and the portion 15 at the same time. Whether the full secondary winding 13 or only the desired portion 15 of the secondary winding 13 is used depends upon the nominal voltage desired. In either case, however, the voltage and phase indicated by the transformer T1 should meet certain accuracy requirements for each standard type of burden or equipment connected to the transformer T1.

Figure 3:
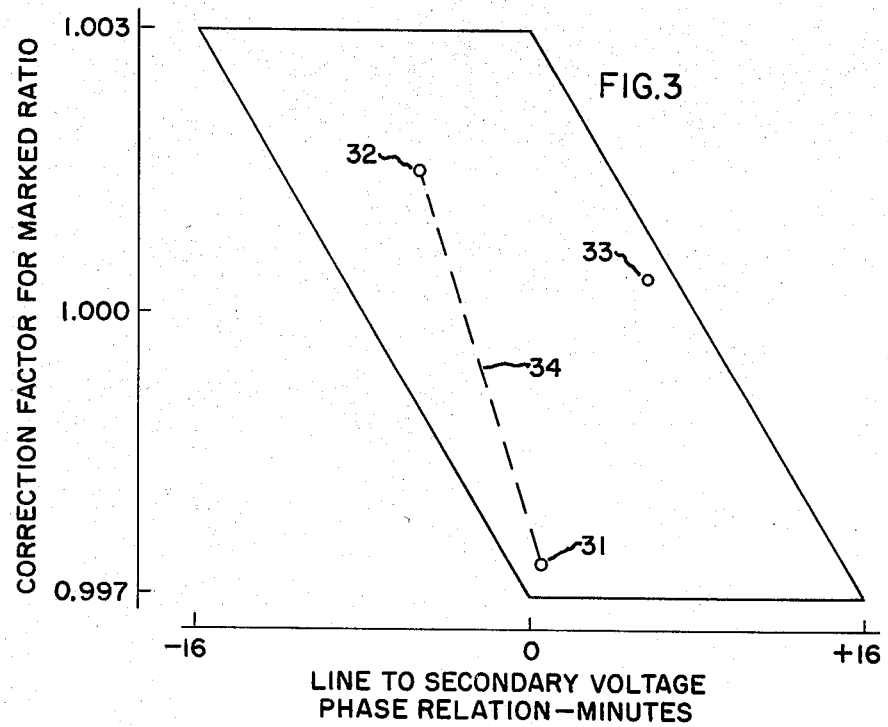
FIG. 3 shows a chart or graph illustrating the operation of the transformer of FIG. 1 and of the transformer of FIG. 2.

FIG. 3 shows a graph or chart illustrating the permissible limits of the 0.3 accuracy class (accuracy in percent) of coupling capacitor and transformer circuits, such as shown in FIG. 1. The Y axis of FIG. 3 shows the correction factor for correcting (by multiplying) the marked ratio of the device so as to determine the line voltage associated with a given secondary winding voltage, and the X axis of FIG. 3 shows the phase relation of the line voltage to the secondary winding voltage, in minutes of angle. A correction factor of 1.000 and a phase relation of 0 minutes under all conditions are of course desirable and most accurate. However, in prior art coupling capacitor and transformer circuits this has been difficult to achieve, so limits have been set for the permissible variations in these voltage and phase relations. In FIG. 3, the four solid lines forming a parallelogram show the permissible limits of the 0.3 accuracy class of coupling capacitor transformer circuits or potential transformers. These lines indicate that the line to secondary voltage phase relation must be between 0 and −16 minutes at a correction factor of 1.003, and must be between 0 and +16 minutes at a correction factor of 0.997. With respect to the circuit of FIG. 1, the point 31 shows a typical selected correction factor and phase angle error for no burden connected to any of the terminals X1, X2, X3 of the secondary winding 13. If a typical standard burden (designated Z by ANS C57.13-1968) of 200 voltamperes and 0.85 lagging power factor is connected across the terminals X1, X3 of the secondary winding 13, then the point 32 typically shows the correction factor and the phase relation for that burden. It will be seen that the correction factor changes considerably due to circuit impedances. For the best accuracy, the phase relation is shifted in a negative direction by adjustment of the tuning inductor L1 with the burden connected. Since, with a given core, the transformer winding geometry determines the amount of leakage inductance between windings, it is difficult to provide windings having the effective leakage inductance between the primary winding and the full secondary winding equal to the effective leakage inductance between the primary winding and a portion of the secondary winding. For this reason, the same standard burden (designated Z but having different characteristics for the appropriate voltage basis) of 200 voltamperes and 0.85 lagging power factor is connected to the terminals X2, X3 for the portion 15 of the secondary winding 13, and if the tuning inductor L1 is not readjusted, the point 33 typically shows the correction factors. The different corrections for the two points 32, 33 seriously affect the accuracy of the voltage and phase measuring equipment, and limit the types of burdens a user can connect to the transformer T1 and still have the outputs meet the 0.3 accuracy requirements.

Figure 2:
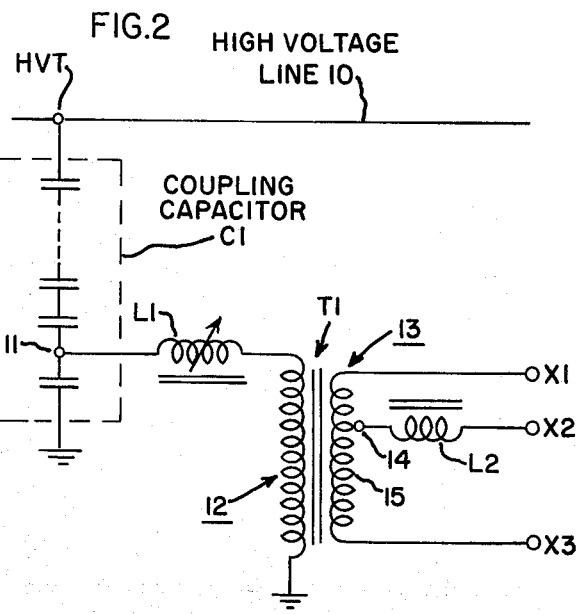
FIG. 2 shows a circuit diagram of a coupling capacitor voltage transformer provided with an inductor in accordance with my invention and connected to a capacitor for measuring the voltage and phase of a power line.

In order to provide a more accurate indication and permit a wider range of burdens, I have provided an improvement to the coupling capacitor voltage transformer T1 as shown in FIG. 2. The circuit of FIG. 2 is similar to FIG. 1, so that corresponding parts have the same reference numerals. In accordance with my invention, I provide an inductive reactor L2 in series between the tap 14 of the secondary winding 15 and the terminal X2. The magnitude of the inductor L2 is chosen or may be varied so that the leakage reactance referred to the primary winding 12 when a given voltampere and power factor burden is connected to the terminals X2, X3 is equal to the leakage reactance referred to the primary winding 12 when the same given burden is connected to the terminals X1, X3. With the inductor L2 so selected, the correction for a given burden connected across either the full secondary winding 13 (terminals X1, X3) or the portion 15 of the secondary winding 13 (terminals X2, X3) will lie along the dashed line 34 in FIG. 3 near the point 32. Subsequently, the line 34 may be rotated about the point 31 by further adjustment of the inductor L1. Thus, once the inductor L2 for the transformer T1 and burden are established, the burden may be connected across either the portion 15 or the full secondary winding 13 of the transformer T1, and substantially the same (along the line 34) correction factor and phase relation will be provided. The single line 34 for the correction provides greater flexibility within the accuracy limits for other burdens, and makes adjustment for several secondary windings easier. Thus, my invention increases the accuracy and ease of adjustment of a coupling capacitor transformer which is used to provide an indication of voltage magnitude and phase relation on high voltage power lines.

Figure 4:
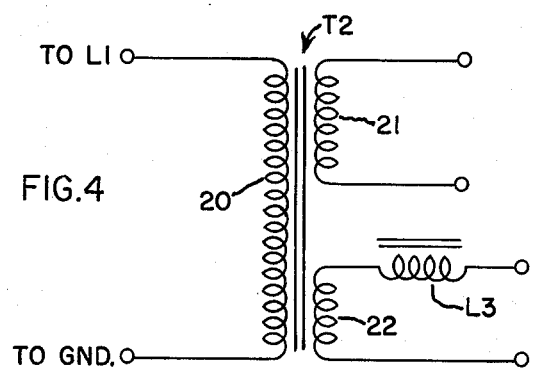
FIG. 4 shows another coupling capacitor voltage transformer arrangement provided with an inductor in accordance with my invention.

While FIG. 2 shows a coupling capacitor voltage transformer T1 having only one secondary winding 15, persons skilled in the art will appreciate that additional secondary windings may be provided, each of which has my inductor connected to its tap. Or, a coupling capacitor voltage transformer T2 may have the arrangement shown in FIG. 4. The primary winding 20 would be connected to the inductor L1 and ground as shown in FIG. 2. Two secondary windings 21, 22 are coupled to the primary winding 20. The leakage reactance between the secondary winding 22 and the transformer primary winding 20 when referred to the primary winding 20 is less than that of the secondary winding 21 referred to the primary winding 20. The secondary winding 22 is provided with an inductor L3 having a magnitude to satisfy the conditions set forth for the inductor L2 in FIG. 2.

It will thus be seen that I have provided a new and improved coupling capacitor transformer arrangement which permits a given burden to be connected across the full transformer secondary winding or across a portion of the transformer secondary winding with substantially the same correction for the true ratio and for the phase relation in power line measurements. Several transformers have been provided with an inductor constructed in accordance with my invention. These tranformers and inductors provided relatively good burden correction such as points along the line 34 (or its extension) in FIG. 3. Persons skilled in the art will appreciate that my inductor may be used with potential transformers where the primary winding is connected directly to the high voltage line. Also, the inductors may be variable. Therefore, while my invention has been described with reference to a particular embodiment, it is to be understood that modifications may be made without departing from the spirit of the invention or from the scope of the claims.

What I claim as new and desire to secure by Letters Patent of the United States is:

1. For use with a coupling capacitor voltage transformer, a potential transformer, or the like having a primary winding adapted to be connected to a source of alternating electrical voltage, and a secondary winding structure coupled to said primary winding, said secondary winding structure having a relatively high leakage reactance portion and a relatively low leakage reactance portion; an improved arrangement comprising: an inductor adapted to be connected to the low leakage reactance voltage portion, said inductor having a magnitude such that the leakage reactance of the high leakage reactance voltage portion referred to the primary winding is substantially the same as the leakage reactance of the low leakage reactance voltage portion referred to the primary winding.

2. A coupling capacitor voltage transformer, comprising:
   a. a primary winding;
   b. at least one secondary winding coupled to said primary winding, said secondary winding having a tap connected thereto that provides an available portion of said secondary winding;
   c. and an inductor connected to said secondary winding tap, said inductor having a magnitude such that it provides the difference in leakage reactance referred to said primary winding provided by all of said secondary winding and provided by said portion of said secondary winding.

3. A coupling capacitor voltage transformer comprising:
   a. a primary winding;
   b. a first secondary winding coupled to said primary winding and having a leakage reactance between said transformer primary winding and said first secondary winding referred to said primary winding that is relatively high;
   c. a second secondary winding coupled to said primary winding and having a leakage reactance between said transformer primary winding and said second secondary winding referred to the primary winding that is relatively low;
   d. and an inductor connected to said second secondary winding, said inductor having a magnitude such that the sum of its reactance and the leakage reactance of said second secondary winding referred to said primary winding is substantially equal to the leakage reactance of said first secondary winding referred to said primary winding.

\* \* \* \* \*